United States Patent
Rhode et al.

[19]

[11] Patent Number: 6,147,522
[45] Date of Patent: Nov. 14, 2000

[54] REFERENCE VOLTAGE CIRCUITRY FOR USE IN SWITCHED-CAPACITOR APPLICATIONS

[75] Inventors: Jason Powell Rhode; Vishnu Shankar Srinivasan; Eric Clay Gaalaas; Johann Guy Gaboriau, all of Austin, Tex.

[73] Assignee: Cirrus Logic, Inc.

[21] Appl. No.: 09/224,390

[22] Filed: Dec. 31, 1998

[51] Int. Cl.[7] ............................................. H03K 27/02
[52] U.S. Cl. .............................................. 327/93; 327/94
[58] Field of Search ................................. 327/91, 93, 94, 327/96, 77, 337; 330/9, 51

[56] References Cited

U.S. PATENT DOCUMENTS

| | | | |
|---|---|---|---|
| 4,546,324 | 10/1985 | Bingham et al. | 330/9 |
| 5,506,526 | 4/1996 | Seesink | 327/91 |
| 5,635,864 | 6/1997 | Jones | 327/77 |
| 5,644,257 | 7/1997 | Kerth et al. | 327/96 |

*Primary Examiner*—Toan Tran
*Assistant Examiner*—Paul Dinh
*Attorney, Agent, or Firm*—James J. Murphy, Esq.; Winstead Sechrest & Minick; Peter Rutkowskie, Esq.

[57] ABSTRACT

Circuitry for selectively sampling a reference voltage with a capacitor 403 includes a first switch 505a for selectively coupling capacitor 403 to a source of a first reference signal during a first operating phase and a second switch 505b for selectively coupling capacitor 403 to a source of a second reference signal during a second operating phase.

19 Claims, 7 Drawing Sheets

REFERENCE VOLTAGE CIRCUITRY FOR USE IN SWITCHED-CAPACITOR APPLICATIONS

BACKGROUND OF THE INVENTION

1. Field of the Invention

The present invention relates in general to electronic circuits and in particular to reference voltage circuitry for use in switched-capacitor application and systems and methods using the same.

2. Description of the Related Art

The ability to process audio information has become increasingly important in the personal computer (PC) environment. Among other things, audio is important in many multimedia applications, such as gaming and telecommunications. Audio functionality is therefore typically available on most conventional PCS, either in the form of an add-on audio board or as a standard feature provided on the motherboard itself. In fact, PC users increasingly expect not only audio functionality but high quality sound capability.

One of the key components in most digital audio information processing systems is the Codec (coder-decoder) unit. Among other things, the Codec converts input analog audio information into a digital format for processing by a companion digital audio processor. The digital processor for example may support sample rate conversion, SoundBlaster compatibility, wavetable synthesis, or DirectSound acceleration, among other things. The Codec also converts outgoing signals from the audio processor from digital-to-analog format for eventual audible output to the user. The Codec may also mix analog and/or digital audio streams.

The digital to analog converters (DACs) and analog to digital converters (ADCs) found in a typical Codec operate from a reference voltage. Therefore, a reference voltage source must be provided whether it be external and coupled to the chip through a dedicated pin or on-chip, such as with a band gap reference. Even for inexpensive Codecs, the reference source must meet certain minimum criteria. Among other things, it must be small, low power consuming and have a good power supply rejection ratio (PSRR). Moreover, different DACs and ADCs often require the generation of different reference voltages. Therefore, the need has arisen for circuits and methods for generating reference voltages which not only meet the above performance criteria, but also allows for the scaling of the reference voltage with the DC value of the power supply voltage.

SUMMARY OF THE INVENTION

The principles of the present invention are embodied in circuitry for sampling a reference voltage with a capacitor and includes a first switch for selectively coupling the capacitor to a source of a first reference signal during a first operating phase and a second switch for selectively coupling the capacitor to a source of a second reference signal during a second operating phase. The principles of the present invention can be applied to a wide variety of circuitry which require charging of a capacitive load. Among other things, these principles allow for the scalable generation of a reference voltage as a function of a general power supply voltage. Notwithstanding, the principles of the present invention allow for the designing and fabrication of reference voltage generation circuitry which is small, low power consuming, and having a good power supply rejection ratio.

BRIEF DESCRIPTION OF THE DRAWINGS

For a more complete understanding of the present invention, and the advantages thereof reference is now made to the following descriptions taken in conjunction with the accompanying drawings, in which.

DESCRIPTION OF THE PREFERRED EMBODIMENTS

Figure 1A:
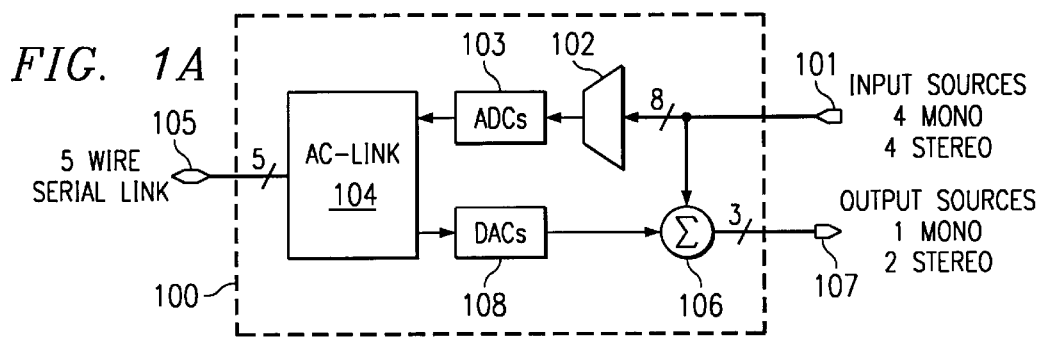
FIG. 1A is a diagram of the major components of a mixed-signal serial Codec according to the principles of the present invention.

FIG. 1A is a diagram of the major components of a mixed-signal serial Codec 100. As discussed further below, when used in a system including a digital audio accelerator (controller), Codec 100 mixes analog data streams received from system-external sources and digital data streams received from the controller. Exemplary Codec 100 is also compliant with the Intel AC '97 specification, revision 1.03, Sep. 15, 1996, and will be described in that environment.

As shown in FIG. 1A, Codec 100 includes input port 101 for receiving data from four mono and four stereo analog input sources. Input multiplexer 102 selectively presents one of the analog inputs received at input port 101 to analog-to-digital converters (ADCs) 103. After conversion of the selected data stream from analog to a digital format, the stream is passed on to an audio Codec (AC) Link driver 104.

AC-Link driver 104 allows Codec 100 to communicate with a companion digital controller via a 5-wire serial link 105. In accordance with the AC '97 specification, serial link 105 consists of two clock lines, two data lines, and a reset line.

The output path of a Codec 100 includes digital-to-analog converters (DACs) 108, for transforming the digital data processed by AC-Link 104 into analog format, and an output mixer 106. Output mixer 106 presents to output port 107 a stereo output, on two lines, and a mono output on a single line. Signals output from output port 107 can then be recorded or delivered to audio components (amplifiers, speakers, etc.) for audible presentation to the user.

Figure 1B:
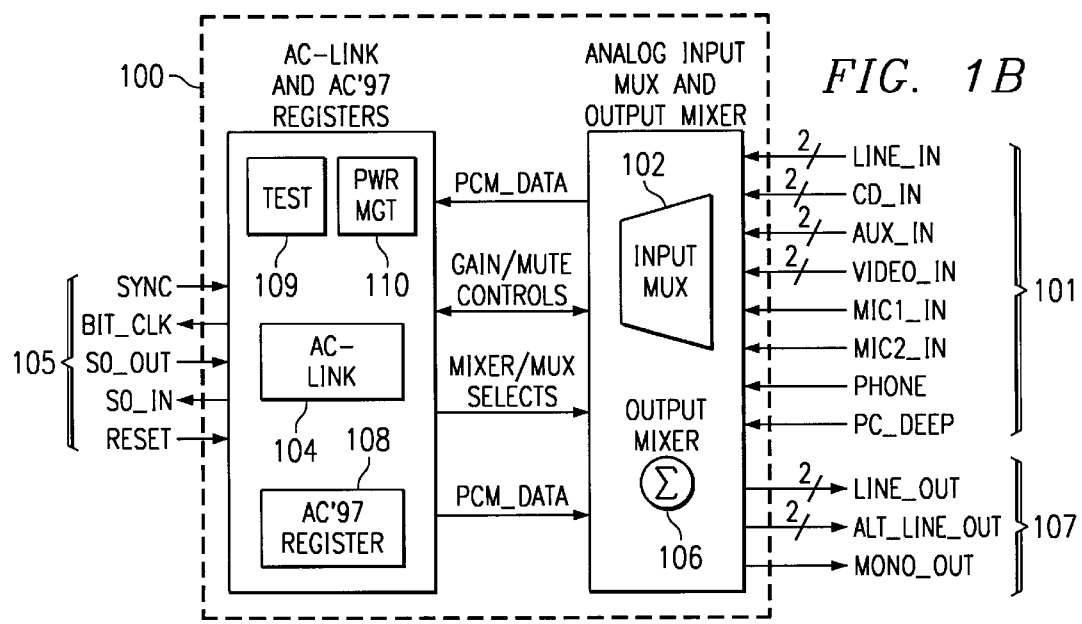
FIG. 1B is an overview diagram of the Codec of FIG. 1A, which includes individual definitions of the inputs and outputs.

FIG. 1B is a more detailed overview diagram of Codec 100, which includes individual definitions of the inputs into input port 101, the lines of 5-wire serial link 105, and the outputs from output port 107. Further, FIG. 1B depicts selected internal data and control signals pertinent to the present discussion. FIG. 1B also generally shows the AC '97 registers 108, internal test circuitry 109 and power management circuitry 110.

As shown in FIG. 1B, the input port 101 is comprised of eight individual inputs, four single line (pin) inputs for receiving mono source information and four two line (pin) inputs for receiving stereo source information. The specific sources include LINE_IN, AUX_IN, VIDEO_IN, MIC1_IN, MIC2_IN, PHONE, and PC_BEEP.

The LINE_IN pair of inputs provide for the input of left and right stereo analog data. The two AUX_IN inputs provide left and right channel stereo analog auxiliary source input. The pair of inputs CD_IN are used for the input of left and right channel CD audio analog data. The input pair labeled VIDEO_IN is provided for inputting left and right channel stereo analog audio signal inputs from a video device.

Inputs MIC1_IN and MIC2_IN are multiplexed single inputs each of which can independently be used as a monophonic analog input source to output mixer 106. The selected input is also provided to input mixer 102. These inputs are in particular provided as alternate microphone connections.

The PHONE single-pin input provides for the input of data from a voice modem and therefore is not coupled to the stereo to mono mixer. The input (single-pin) labeled PC_BEEP provides a PC_BEEP connection to Codec 100. This input is also not coupled to the stereo to mono mixer.

5-Wire AC link 105 provides for the input of the synchronization (SYNC) signal, data from the controller (SD_OUT) and reset signals, and for the output of the link clock (BIT_CLK) and data to the controller(SD_IN), in accordance with the AC '97 interface specification. These signals are best described in reference to FIG. 2.

Figure 2:
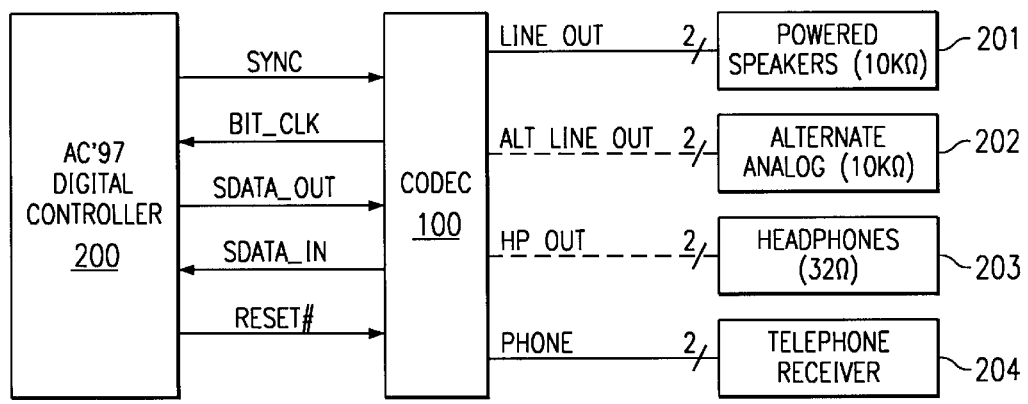
FIG. 2 is a diagram the AC link connections between Codec and a digital audio controller.

FIG. 2 depicts the AC link connections between Codec 100 and an exemplary digital AC '97 controller 200. Controller 200 could be any controller conforming to the Intel AC '97 specification, such as a Crystal Semiconductor CS-4610 device configured as an AC '97 controller.

BIT_CLK is the main clock which defines the protocol used on link 105 and in particular, is used by controller 200 to synchronize signals SYNC and SDATA_OUT being passed back to Codec 100. The signal SYNC is generated by controller 100 and presented to Codec 100 to define the beginning of a frame of AC'97 audio data and is synchronous to the rising edge of BIT_CLK.

The signal SDATA_OUT (serial output data) is generated by controller 100 and input to Codec 100. Specifically, this data is positioned by controller 200 on the rising edge of BIT_CLK and Codec 100 then samples this data on the falling edge of BIT_CLK.

SDATA_IN is used by controller 200 to receive serial data and status information from Codec 100. Specifically, Codec 100 positions data on the SDATA_IN line on the rising edge of BIT_CLK and controller 200 samples of the signal transferred on this line on the falling edge of BIT_CLK. Reset signal RESET is generated by controller 200 and forces Codec 100 into power-up initialization.

Output port 107 includes an output pair LINE_OUT, an ALT_LINE_OUT output pair and a single MONO_OUT line. The primary output LINE_OUT is available to drive the left and right channels of a stereo audio device, such as powered speakers 201 or similar audio loads. The alternate output (ALT_LINE_OUT), provides a connection to additional stereo audio devices or simply an optional stereo output. The MONO_OUT line (pin) is the device monophonic audio, and finally, the PHONE output is provided to transfer data to a telephonic speakerphone, handset or headset.

Figure 3:
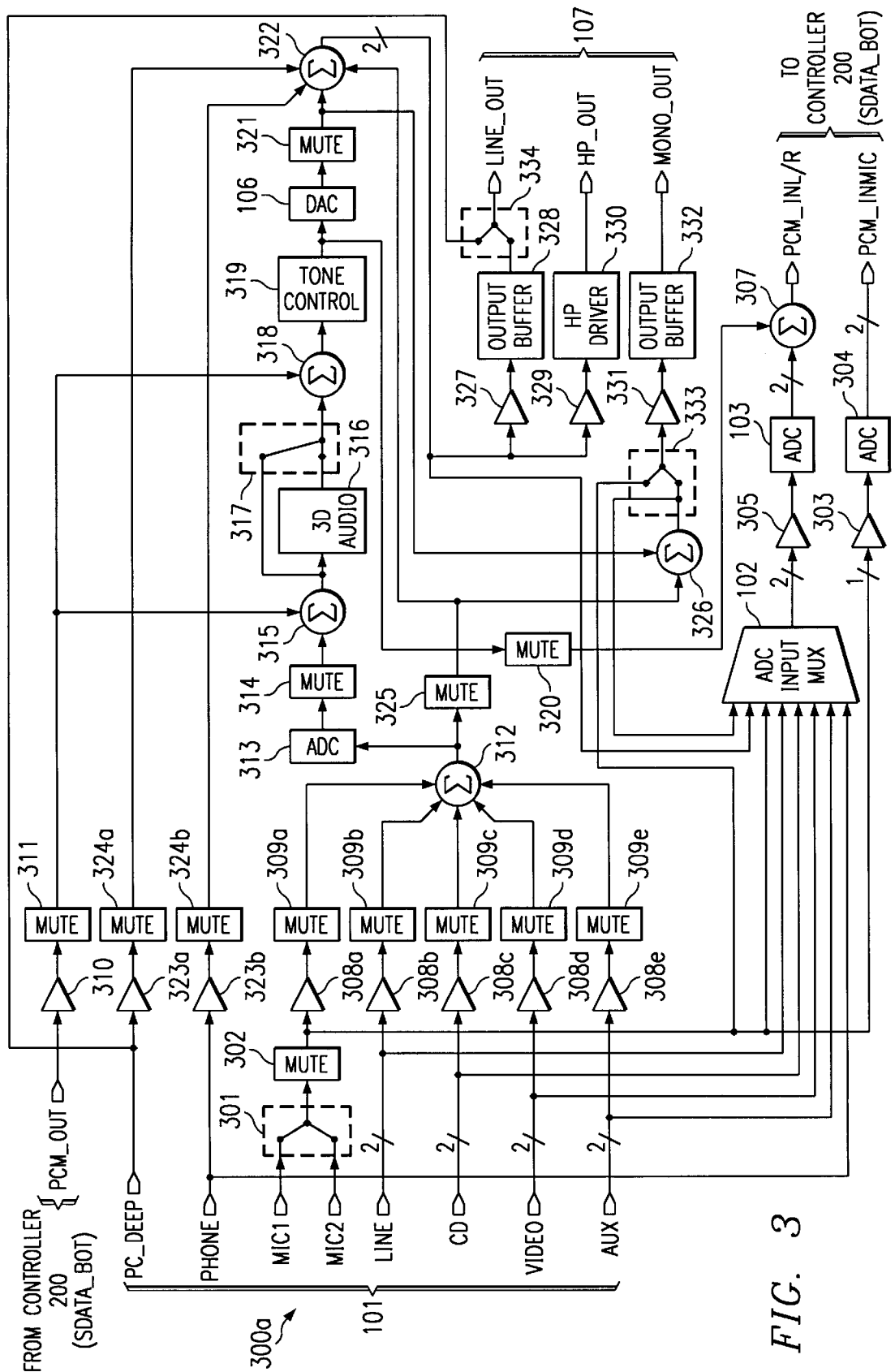
FIG. 3 is a diagram of a representative embodiment of mixer of the Codec of FIGS. 1A and 1B.

FIG. 3 is a more detailed diagram of a first embodiment of the mixer 300A of Codec 100. The individual components/subsystems are controlled by the contents of corresponding registers within register 108.

Codec 100 includes multiple processing paths for mixing and converting data being exchanged between controller 200 and external analog audio devices. The Codec 100 data paths can generally be described as follows.

During the input of data to controller 200, selector 102 selects one stream from among a set of streams including the unmixed input analog streams (MIC1 or MIC2, LINE_IN, CD, VIDEO and AUX_IN). The selected stream, after conversion to a digital format, is transmitted to controller 200 via the SDATA_IN line of link 105.

During the output of data streams from controller 200 to external audio devices, PCM data from controller 200 is input through SDATA_OUT port and selectively mixed with the audio input streams (MIC1 or MIC2, LINE_IN, CD, VIDEO or AUX_IN), converted into analog format, and output to the given external audio devices via the LINE_OUT, MONO_OUT or ALT_LINE_OUT pins.

Codec 100 further includes a number of other selectable paths for processing flexibility.

In one input path, MIC1 or MIC2, LINE, CD, VIDEO and/or AUX inputs data presented at 101 are passed to input multiplexer 102 directly. Specifically, a switch 301 allows the user to select for input between data generated by microphone 1 (MIC1) and by microphone 2 (MIC2). The selected microphone input is then amplified by amplifier 302 by approximately +20 dB. The microphone analog data output from amplifier 302 is presented not only to the input of input multiplexer 102, but also through an amplifier 303 and a dedicated microphone analog-to-digital converter 304. The direct data path through amplifier 303 and ADC 304, when used, allows the transmission of PCM microphone data to controller 200 via the SDATA_IN line.

The remaining signals, LINE, CD, VIDEO and/or AUX are provided directly to multiplexer 102. Multiplexer 102 can thus select directly from any one of the signals presented at input 101. Input multiplexer 102 has independent control of the left and right channels which advantageously facilitates returning a mono mix of the stereo line channel and/or echo cancellation on the microphone source by controller 200. In addition to selecting any one of the five analog input sources, such as the MIC, CD, LINE_IN, VIDEO or AUX, presented at inputs 101, multiplexer 102 can also select from the stereo output mix or mono output mix.

The input stream selected by input multiplexer 102 is amplified by amplifier 305 which in turn drives main analog-to-digital converters (ADCs) 103. Each ADC is generally a delta-sigma ($\Delta\Sigma$) converter. After analog-to-digital conversion, the two-line stereo input stream is passed through mute control circuitry 306 and on to digital mixer 307.

Mixer 307 is provided to mix the input signals selected by multiplexer 102 with mixed digital stereo data tapped from the stereo mixing section. The data received from the stereo mixing section by digital mixer 307 results from the mixing of PCM data received through the SDATA_OUT line of AC'97 link 105 with the MIC1 or MIC2, LINE, CD, VIDEO or AUX inputs of input port 101 after passage through volume controls 308 and mute controls 309. Similarly, the PCM data from controller 200 is input through volume controls 310 and mute controls 311.

The analog inputs MIC1 or MIC2, LINE, CD, VIDEO or AUX are mixed by an analog stereo effect mixer 312 before conversion to digital format by effects path ADC 313. Additional mute controls 314 are provided at the output of ADC 313.

A digital mixer 315 selectively mixes the outputs of analog-to-digital converter 313 received from controller 200 through volume control 310 and mute control 311. If mixing of PCM data with the mixed and converted analog data from the analog inputs is not desired before 3-D processing, only the converted analog input data is passed through mixer 315. The digital mixed signal output from mixer 315 can optionally undergo 3-D audio processing by 3-D audio circuitry 316 or can bypass 3-D processing circuitry 316 through switch 317.

Another digital mixer 318 provides an optional path for mixing received data from controller 200 with the data input from inputs 101. In this case, the mixing of the data originally input as analog at inputs 101 is mixed with the digital data direct from controller 200 after optional 3-D processing by 3-D processing circuitry 316. In other words, 3-D processing for the PCM data can be selectively foregone, notwithstanding the fact that 3-D processing is performed on the converted analog input data. The output of mixer at 318 is then provided to tone controls 319. The two-channel output of tone controls 319 are passed through mute controls 320 and directly therefrom to digital mixer 307.

The two-channel output of tone control 319 is also provided to main digital-to-analog converters 106. The digital-to-analog converters (DACs) of Codec 100 may be, for example, delta-sigma converters. Analog output from main DAC converter 106 is passed through mute controls 321 and on to analog stereo output mixer 322. Analog stereo output mixer 322 mixes the analog signal output from main DAC 106 with the PC_BEEP and PHONE inputs received from input port 101 (through volume controls 323*a*–323*b* and mute controls 324*a*–324*b*). Mixer 322 can also receive analog data directly from analog effects mixer 312 through a 90 dB analog bypass path. In particular, the analog bypass path takes analog data directly from analog stereo effects mixer 312, passes them through mute controls 325 and directly on to analog input mixer 322.

Mixed analog output data from analog mixer 322 provides a further input to input multiplexer 102. Most importantly, the output of analog stereo output mixer 322 passed to the LINE_OUT and HP_OUT outputs of Codec 100 output port 107 for transmission to external audio devices. The LINE_OUT output is driven by master volume control 327 and output buffer 328 while the HP_OUT output is driven by headphone volume control 329 and headphone driver 330.

The mono output (MONO_OUT) is not directly generated from analog stereo mixer 322. Instead, a mono output mixer 326 mixes in the PC_BEEP and PHONE sources with the PCM and analog sources. This scheme is advantageous, for example, because the mono mix from the mono output port may be used to drive a phone handset. Mixing the phone input back into the handset may cause echoes at the other end of the phone line. Therefore, the mono mix is taken from the analog input mixer 312 through the analog bypass, which does not include the PC_BEEP or PHONE source signals.

For a complete description of Codec 100, refer to copending and co-assigned U.S. patent application, entitled CIRCUITS AND METHODS FOR IMPLEMENTING AUDIO CODEC AND SYSTEMS USING THE SAME, filed on Apr. 4, 1997 and the assigned Ser. No. 08/833,185, incorporated herein by reference.

Figure 4A:
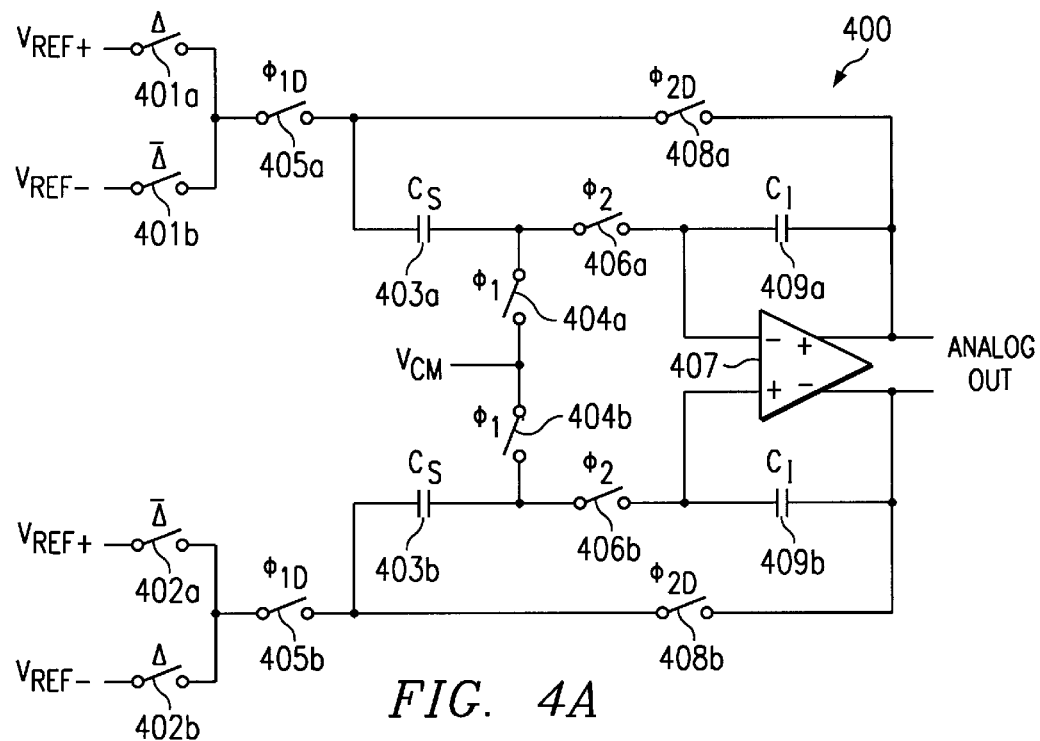
FIG. 4A is a diagram of the typical switched-capacitor part of a delta-sigma digital to analog converter (DAC)

FIG. 4A depicts a typical fully-differential switched-capacitor low-pass filter 400 found in delta-sigma DACs, such as DACs 106 discussed above. This design operates off the reference voltages VREF+ and VREF−.

A number of different means have been used to generate the reference voltages VREF+ and VREF−, including techniques which produce a voltage which is independent of supply voltage, temperature, process, and similar factors. It is also important to note the difference between the rejection of power supply transients and independence from the mean voltage of the power supply. Many applications require that both criteria be met while other applications only require that the reference produced not be disturbed by transients.

One technique for providing a reference voltage is to produce a bandgap voltage reference, where the difference in base-emitter voltage between two bipolar devices with different current densities is applied across a fixed resistor. Since this method produces a voltage which does not scale with the average value of the supply, operation across a wide supply range is difficult. Another approach is to provide a pin to allow use of a chip-external reference source. This however simply shifts the problem from the chip maker the system designer. For low cost applications, the inclusion of an additional component is a poor design choice. Instead, designers often just tie the reference pin to the power supply voltage and use a very large off-chip decoupling capacitor for filtering. However, to achieve a good PSRR at low frequencies, for example at 60 Hz, this capacitor would be prohibitively large.

Figure 4B:
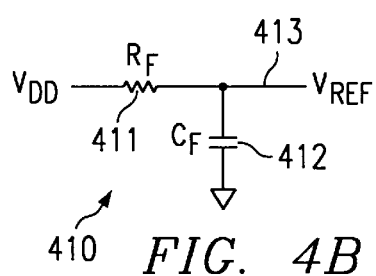
FIG. 4B is a diagram of the typical circuit used to generate the reference voltages required for the operation of the switched-capacitor circuitry of FIG. 4A.

A possible circuit for generating reference voltages to drive DAC circuitry 400 is shown in FIG. 4B. As will become apparent from a discussion of the operation of circuitry 400, this type of reference voltage source is alone not generally adequate for the task.

Figure 4C:
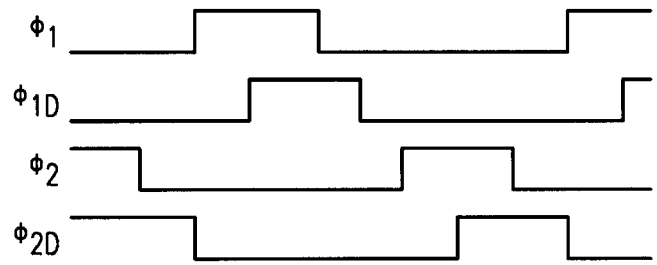
FIG. 4C is a timing diagram illustrating the operation of the switched-capacitor circuitry of FIG. 4A.

The one-bit output Δ of a delta-sigma modulator (not shown) is used to selectively switch the reference voltages VREF+ and VREF− to the two differential paths. Transistors 401*a* and 401*b* control the first path and transistors 402*a* and 402 the second path. The input voltages are then switched through circuitry 400 generally in accordance with the timing diagram of FIG. 4C.

When clock $\Phi_1$ is active (high), a first plate of each sampling capacitor ($C_S$) 403*a* and 403*b* is connected the common mode voltage, Vcm, through switches 404*a* and 404*b* respectively. Then, when clock $\Phi_{1D}$, which is a delayed version of clock $\Phi_1$, closes switches 405*a* and 405*b*, charge is transferred to sampling capacitors 403*a* and 403*b*. If Δ is a logic high, then sampling capacitor 403*a* is charged to VREF+ and sampling capacitor 403*b* to VREF−. If Δ is a logic low, the opposite occurs.

Next, $\Phi_1$ opens switches 404*a* and 404*b* and a charge $Q_s=(V_{IN}-V_{CM})C_S$ is trapped on each sampling capacitor $C_S$. $\Phi_{1D}$ then returns low. Subsequently, clock $\Phi_2$ closes switches 406*a* and 406*b* and sampling capacitors $C_S$ are connected to corresponding inputs of operational amplifier 407. Clock $\Phi_{2D}$ (the delayed version of $\Phi_2$) closes switches 408*a* and 408*b* thereby forcing charge $Q_S$ from sampling capacitors 403a and 403b to integration capacitors (C₁) 409a and 409b respectively.

Typically, a voltage reference source, such as source 410 shown in FIG. 4B includes a large value filtering resistor (R$_F$) 411 and a small filtering capacitor (C$_F$) 412 which produce in a low-pass filtered version of the power supply output. The values of resistor 411 and capacitor 412 are normally chosen to attenuate 60 Hz components output from the power supply to a satisfactory level. For example, if the pole frequency is chosen to be 0.6 Hz, the PSRR at 60 Hz is 40 dB. To keep the capacitor C$_F$ small, the resistor R$_F$ must be large. For a 1uF capacitor, the resistor would be about 250 kOhms. This circuit therefore has a significant disadvantage. Due to the large value of resistor R$_F$, any current drawn from the filtered node 413 to charge C$_S$ will cause VREF to droop below VDD, which is undesirable. A buffer could be added between node 413 and the converter, but this would cost power and chip area and would be difficult to implement since VREF is substantially equal to the supply voltage VDD.

In the specific case of switched-capacitor circuitry 400, the following occurs when reference voltage source 401 or similar circuitry is used to supply the reference. As noted above, when $\Phi_{1D}$ is active the reference voltage is sampled on to the sampling capacitors C$_S$ and therefore the reference source must be capable of charging the sampling capacitors to either VREF+ or VREF−. If the sampling frequency is f$_s$, the switched capacitors C$_S$ each drain an amount of current from the reference voltage source equivalent to that drained by a resistor of value 1/(f$_s$*C$_S$). This causes the reference voltages VREF+ and VREF− to droop as described above.

The concepts of the present invention are best described in view of FIG. 5. In switched-capacitor circuit 500, each differential path receives its input through three sets of switches. For the upper path, switch pair 501 selectively input either VDD or GND in response to the output Δ of the delta-sigma modulator. At the same time, switches 502a and 502b selectively input either VREF+ or VREF− to the lower path, depending again on the output Δ of the delta-sigma modulator. Switches 505a and 505b in turn switch the outputs of switch pairs 501 and 502 to sampling capacitor 403a in response to signals $\Phi_{1DR}$ and $\Phi_{1DF}$ respectively. Switches 506a and 506b perform the same function with regards to switch pairs 503 and 504 and sampling capacitor 403b.

Figure 5B:
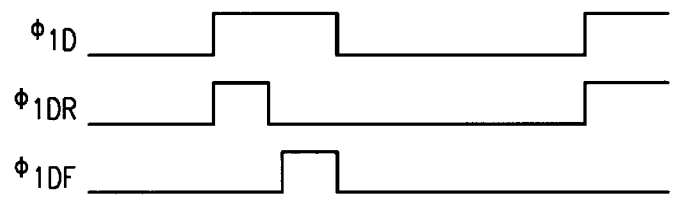
FIG. 5B is a timing diagram illustrating selected control signals used during the operation of the circuitry of FIG. 5A.

FIG. 5B is a diagram illustrating the relationship between signal $\Phi_{1D}$ and signals $\Phi_{1DR}$ (the initial or "rough" phase) and $\Phi_{1DF}$ (the "fine" phase). During the "rough" phase, sampling capacitors (C$_S$) 403 are charged to either VDD or GND from the power supply. The power supply provides all of the DC charge needed to charge capacitors C$_S$, plus some error charge due to power supply transients. During the "fine" phase, the sampling capacitors C$_S$ are coupled to the reference voltages VREF+ and VREF− through switches 505b and 506b. Since capacitor 511 (see FIG. 5C) is relatively large in comparison to the sampling capacitors C$_S$, the voltage errors on the sampling capacitors are reduced by their ratios with capacitor 115, thereby eliminating any error charge on the sampling capacitors. Since all the DC charge is provided during the "rough" phase from the power supply, the VREF nodes do not droop.

Figure 5A:
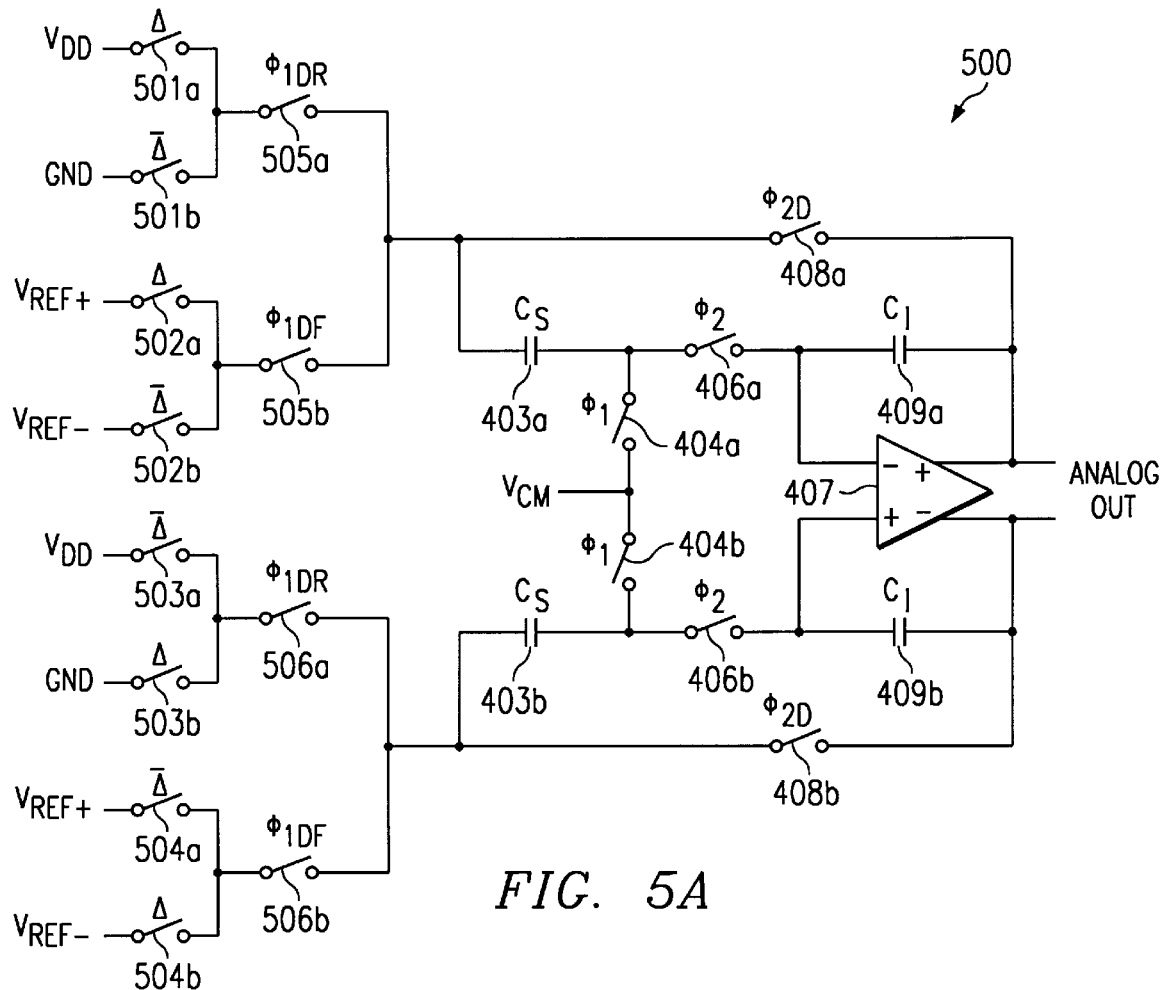
FIG. 5A is a diagram of a switched-capacitor circuit for use in a digital-to-analog converter and embodying the principles of the present invention.
Figure 5C:
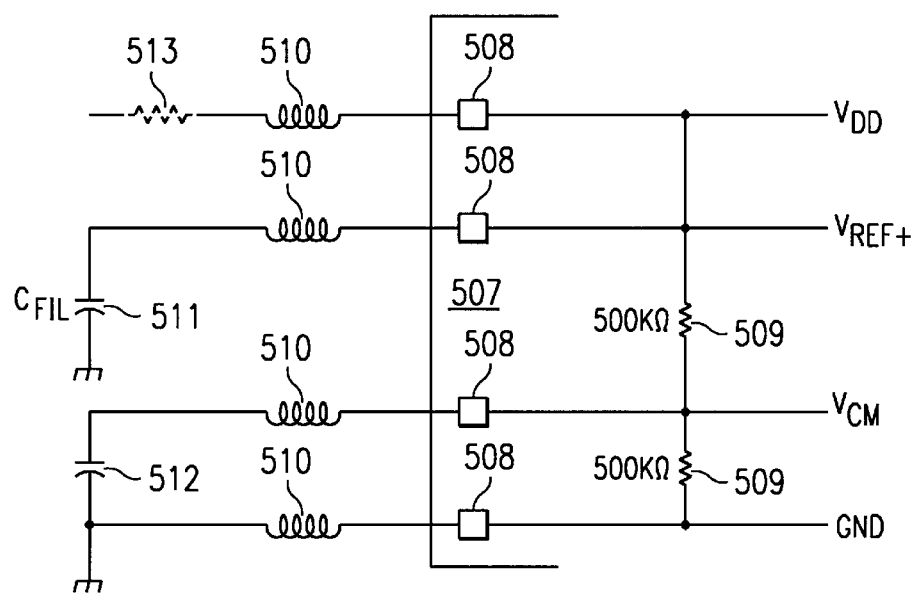
FIG. 5C is a diagram of circuitry for generating the reference voltages used during the operation of the circuitry of FIG. 5A in accordance with the present principles.

FIG. 5C depicts one technique for generating the reference voltages used in FIG. 5A. Here, the relevant portion of a chip 507 is shown, including bondpads 508 and on-chip resistors 509a and 509b. Externally, the corresponding bondwires 510 and off-chip capacitors 511 and 512 are shown. Initial theory suggests that an external resistor 512 (shown in dashed lines) is required provide charge to capacitor 511. Surprisingly however, experimental results have shown that resistor 512 is not needed at all. Analysis reveals that this benefit results from the fact that when the sampling capacitors C$_S$ are coupled to the filter capacitor C$_{FIL}$ 511, they have already been charged to VDD. Input from the power supply is still filtered, with a pole at $F_{pole} = \frac{1}{2}\pi F_S \cdot C_S / C_{FIL}$ or about 0.5 Hz. Preferably, provisions are made to quickly charge capacitor C$_{FIL}$ at startup.

Figure 6A:
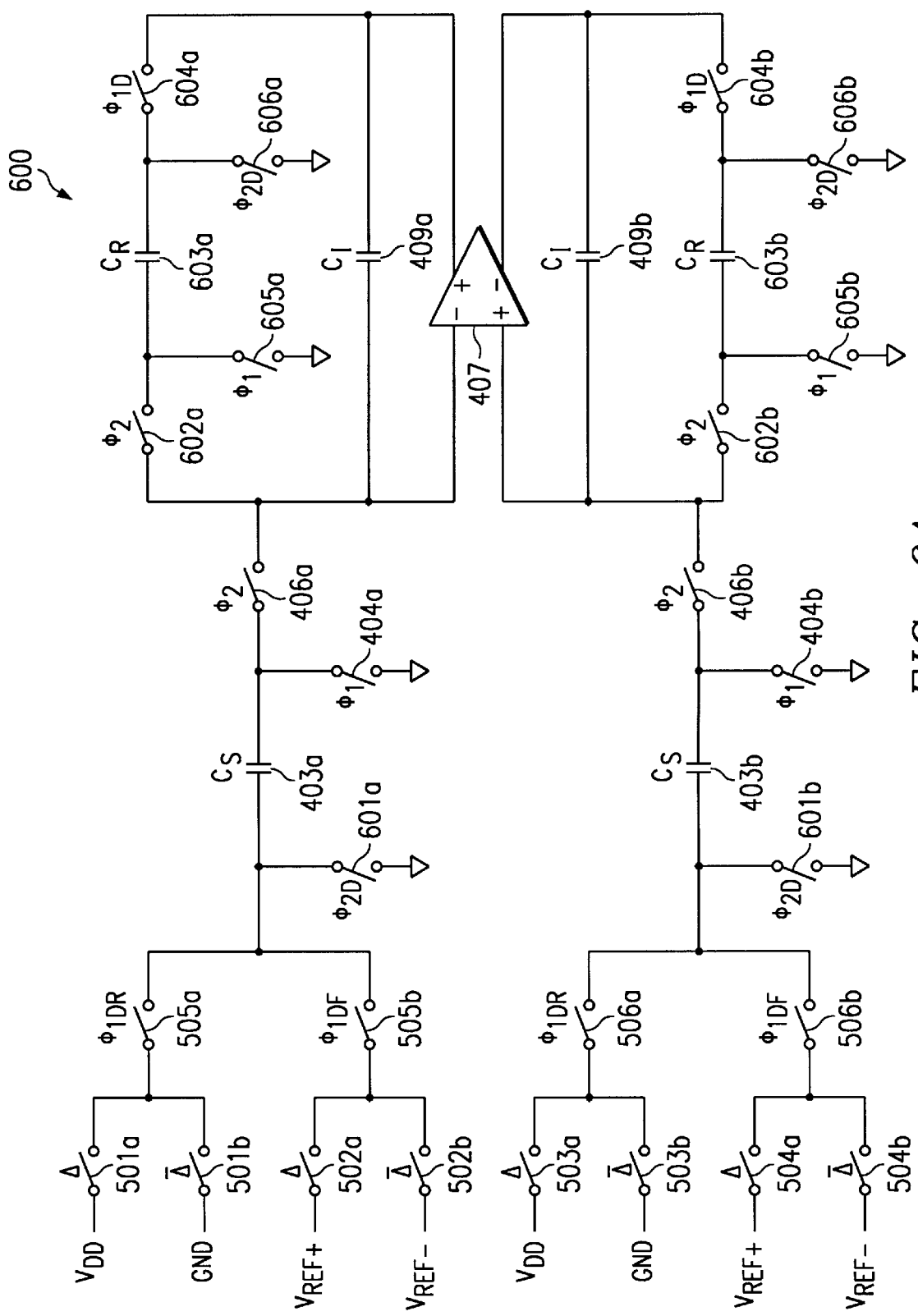
FIG. 6A is a diagram of additional exemplary switched-capacitor circuitry embodying the present principles and suitable for use in a delta-sigma DAC.

FIG. 6A is a diagram of a further application of the present inventive principles in the switched capacitor section 600 of a delta-sigma DAC. The operation of circuitry 600 generally follows that of circuitry 500. In this case, however, a low-pass filter is included in each feedback loop, each of which includes switches 602 and 604 in series with reference capacitors (C$_r$) 603 and switches 605 and 606 in parallel with capacitors (C$_r$) 603. During $\Phi_1$ sampling capacitors C$_s$ are charged by switches 505, 506 and 404. The existing charge on capacitors C$_r$ and C$_i$ is forced to the inputs of opamp 407 by switches 604 and 605. During $\Phi_2$, capacitors C$_i$ and C$_r$ are charged by the sampling capacitors C$_s$ and switches 406, 601, 602 and 606. Capacitors C$_i$ and C$_r$ implement a low-pass filter with a pole at $F_{pole} = F_s * C_r / C_s$, where F$_{pole}$ is the pole frequency and F$_s$ is the sampling frequency.

Figure 6B:
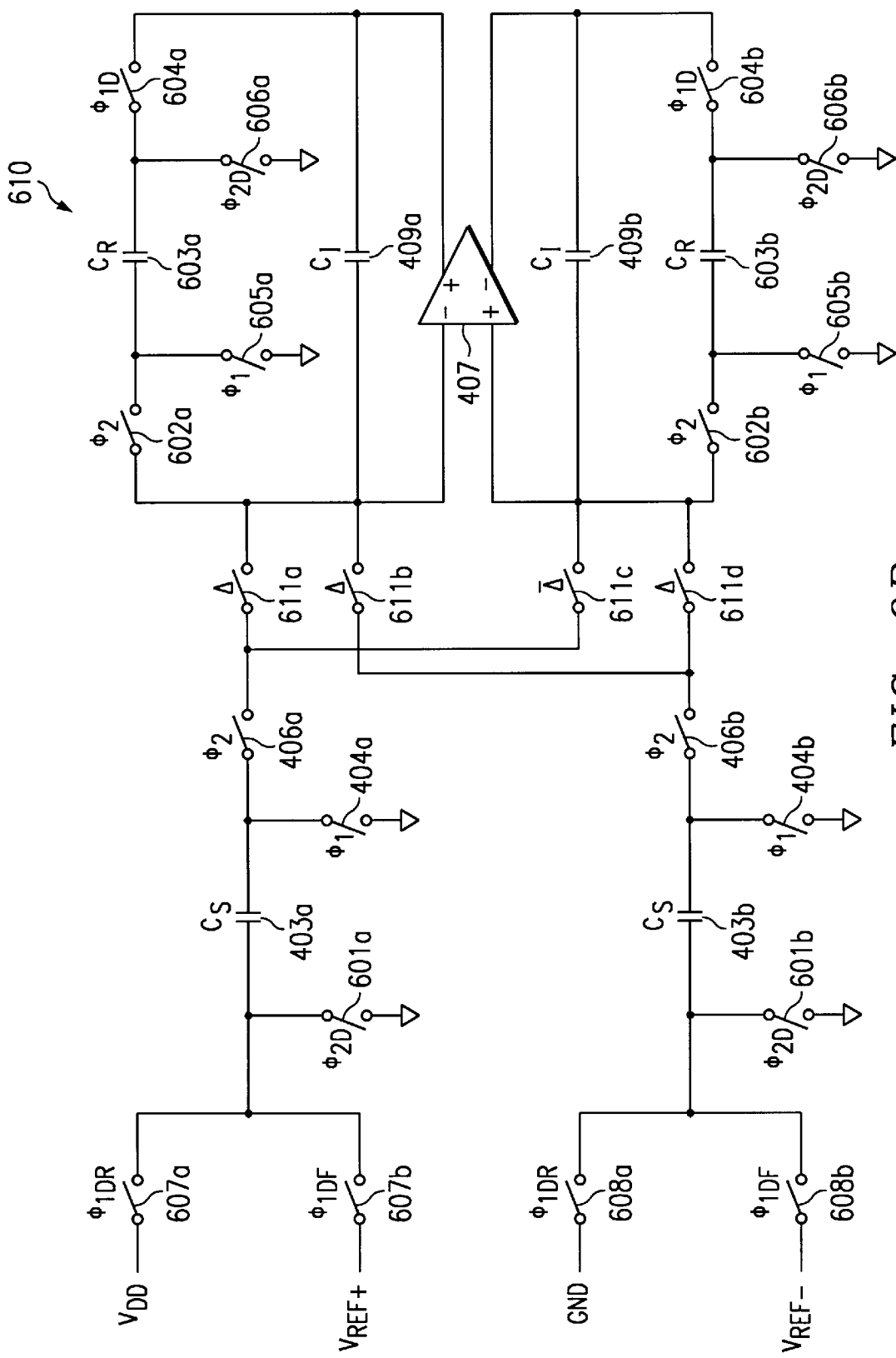
FIG. 6B is a diagram of an alternate configuration of the exemplary circuitry of FIG. 6A.

A similar approach is depicted in FIG. 6B, which also is a diagram of the switched capacitor section 610 of a delta-sigma DAC. Here, the reference voltage V$_{ref}$ is sampled by switches 607 and 608 onto sampling capacitors C$_s$, independent of the value of delta, during $\Phi_1$. Then, during $\Phi_2$, the charge on sampling capacitors C$_s$ is transferred to the summing node of opamp 407, with the direction of transfer controlled by delta through switches 611.

Figure 7:
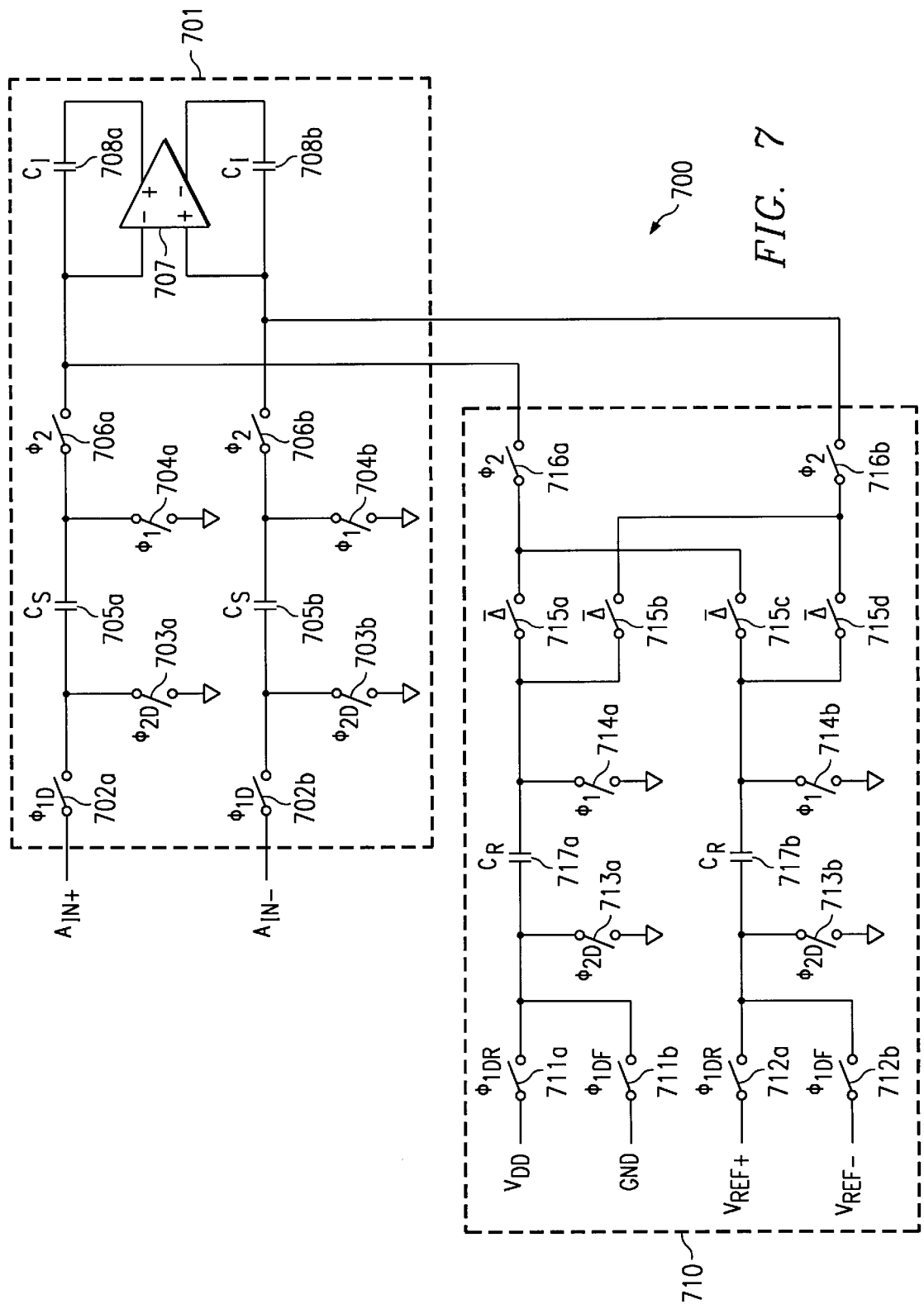
FIG. 7 is a diagram of an exemplary analog to digital converter (ADC) embodying the present principles.

In many delta-sigma ADCs, there is a switched-capacitor DAC incorporated in the reference feedback loop. An example of such a circuit is shown in the diagram of ADC 700 of FIG. 7. Here, typical ADC circuitry is shown generally at 701. The operation of this circuit block is essentially as follows. During $\Phi_1$, the analog data at inputs Ain+ and Ain− are sampled by switches 702 and 704 on to the sampling capacitors 705. During $\Phi_2$, integration capacitors (C$_i$) 708 are charged by switches 706.

The DAC circuitry 710 operates as follows. During $\Phi_1$, the reference voltage is sampled as described above by switches 711, 712 and 714. During $\Phi_2$, switches 713 and 716 transfer the charge on reference capacitors (C$_r$) 717 to the summing nodes of opamp integrator 707/708 through switches 715. Switches 715 control this charge transfer in response to the delta signal (i.e. the transfer is done in a data dependent fashion). A similar result can be achieved by a data-dependant sampling of the reference and a data independent transfer of the charge to the integrator.

In sum, the present inventive concepts provide a simpler way of generating voltage references. This voltage reference scales with the value of the supply, which can enable circuit operation across a wide range of supplies. It consumes a minimal amount of power, and occupies very little on-chip area, without requiring expensive external components or compromising power-supply transient rejection.

Although the present invention and its advantages have been described in detail, it should be understood that various changes, substitutions and alterations can be made herein without departing from the spirit and scope of the invention as defined by the appended claims.

What is claimed is:

1. Circuitry for sampling a reference voltage with a capacitor comprising:
   a first switch for selectively coupling the capacitor to a voltage supply rail sourcing a first reference signal during a first operating phase; and
   a second switch for selectively coupling the capacitor to a second capacitor to generate a second reference signal during a second operating phase, the second reference signal comprising the first reference signal filtered for AC noise.

2. The circuitry of claim 1 wherein the first and second reference signals have a voltage selected to be approximately equal to a power supply voltage in response to a first state of a control signal.

3. The circuitry of claim 2 wherein the first reference and second reference signals have a voltage selected to be approximately zero volts in response to a second state of the control signal.

4. The circuitry of claim 3 wherein the control signal is generated by a delta-sigma modulator.

5. The circuitry of claim 1 wherein said capacitor comprises a sampling capacitor in a digital to analog converter.

6. The circuitry of claim 1 wherein said capacitor comprises a sampling capacitor in an analog to digital converter.

7. Circuitry for generating a reference voltage comprising:
   a first switch for sampling a first reference voltage onto a first capacitor during a first operating phase; and
   a second switch for coupling charge from a second capacitor to the first capacitor during a second operating phase.

8. The circuitry of claim 7 wherein the second capacitor is substantially larger than the first capacitor.

9. The circuitry of claim 7 and further comprising a resistor coupling the second capacitor with the first reference voltage.

10. The circuitry of claim 7 wherein the first reference voltage comprises a chip supply voltage.

11. A method for sampling a voltage in switched capacitor circuitry comprising the steps of:
    during a first operating phase, coupling a sampling capacitor to a source of a unfiltered reference voltage; and
    during a second operating phase, coupling the sampling capacitor to a source of a filtered reference voltage.

12. The method of claim 11 and further comprising the step of selecting the source of the unfiltered voltage between a positive voltage source and ground in response output from a delta-sigma modulator.

13. The method of claim 11 and further comprising the step generating the filtered reference voltage by filtering the unfiltered reference voltage.

14. The method of claim 13 wherein said step of coupling the sampling capacitor to a source of a filtered reference voltage comprises the substeps of:
    charging a second capacitor through a resistor from the source of the unfiltered voltage, the second capacitor being substantially larger than the sampling capacitor; and
    coupling the second capacitor with the sampling capacitor.

15. An audio data processing device comprising:
    a data converter including switched-capacitor circuitry, said switched capacitor circuitry comprising:
    a sampling capacitor;
    a first switching circuit for selectively roughly charging said sampling capacitor with a voltage supplied by a voltage supply rail;
    and
    a second switching circuit for selectively finely charging said sampling capacitor, said second switching circuitry coupling said sampling capacitor to a filtering capacitor to filter said voltage supplied by said voltage supply rail for AC noise.

16. The audio data processing device of claim 15 wherein said converter comprises a digital to analog converter.

17. The audio data processing device of claim 15 wherein said converter comprises an analog to digital converter.

18. The audio data processing device of claim 15 and further comprising a delta-sigma modulator for generating a signal controlling third switching circuitry for selectively switching a selected one of a plurality of voltage supply rails to said first switching circuitry.

19. The audio data processing of claim 15 and further comprising a delta-sigma modulator for generating a signal controlling third switching circuitry for selectively switching a selected one of a plurality of signals generated by filtering a selected one of plurality of voltage rail voltages to said second switching circuitry.

* * * * *